(12) United States Patent
Dejaco et al.

(10) Patent No.: US 11,293,939 B2
(45) Date of Patent: Apr. 5, 2022

(54) METHOD AND DEVICE FOR DETECTING SENSOR ERRORS

(71) Applicant: Siemens Mobility GmbH, Vienna (AT)

(72) Inventors: Daniela Dejaco, Graz (AT); Bernhard Lukas Girstmair, Graz (AT); Gerald Grabner, Graz (AT); Andreas Haigermoser, Oberhaag (AT); Johannes Simon, Graz (AT)

(73) Assignee: Siemens Mobility GMBH, Vienna (AT)

( * ) Notice: Subject to any disclaimer, the term of this patent is extended or adjusted under 35 U.S.C. 154(b) by 132 days.

(21) Appl. No.: 16/589,777

(22) Filed: Oct. 1, 2019

(65) Prior Publication Data
US 2020/0103437 A1 Apr. 2, 2020

(30) Foreign Application Priority Data

Oct. 2, 2018 (AT) ............................... A 50843/2018

(51) Int. Cl.
| | |
|---|---|
| *G01P 21/00* | (2006.01) |
| *B61K 9/02* | (2006.01) |
| *G01M 17/08* | (2006.01) |
| *G01P 15/09* | (2006.01) |

(52) U.S. Cl.
CPC ............... *G01P 21/00* (2013.01); *B61K 9/02* (2013.01); *G01M 17/08* (2013.01); *G01P 15/09* (2013.01)

(58) Field of Classification Search
CPC ...... G01P 21/00; G01P 15/09; G01P 15/0907; G01P 15/0915; G01P 15/0922; B61K 9/02; G01M 17/08

USPC .. 73/1.01, 1.02, 1.06, 1.16, 1.37–1.39, 1.57, 73/1.59, 1.75–1.78, 514.01–514.38; 324/202; 702/85, 90, 92, 93, 96, 98, 104, 702/116, 141
See application file for complete search history.

(56) References Cited

U.S. PATENT DOCUMENTS 5,506,454 A 4/1996 Hanzawa et al.
5,864,259 A * 1/1999 Persson .................. G01R 27/06
333/115

FOREIGN PATENT DOCUMENTS

| CN | 104237845 | 12/2014 |
|---|---|---|
| DE | 102008001571 | 11/2009 |
| DE | 102009031182 | 12/2010 |
| DE | 102011106302 | 9/2012 |
| DE | 102012217721 | 4/2014 |
| EP | 1217667 | 6/2002 |

(Continued)

*Primary Examiner* — Robert R Raevis
(74) *Attorney, Agent, or Firm* — Cozen O'Connor

(57) ABSTRACT

Method for detecting sensor errors, wherein measurements are taken, discharge time data with a first discharge time constant is read out from a data storage unit of the sensor and corresponding measurement signals as well as the discharge time data are transmitted to a computing unit, where a signal processing, a signal evaluation and a data evaluation occur in the computing unit and filtered signals are formed by filtering the measurement signals, where parameter values of a discharge function are determined via a logarithmic function of the filtered signals, a second discharge time constant is determined from the discharge function and where the first discharge time constant and the second discharge time constant are compared to detect errors, faults or damage of the sensor such that the influences of sensor errors on the measurements can be reduced.

18 Claims, 2 Drawing Sheets

(56) References Cited

FOREIGN PATENT DOCUMENTS

| | | |
|---|---|---|
| JP | 2001-209444 | 9/2001 |
| WO | WO 2013/014686 | 1/2013 |
| WO | WO2014048768 | 4/2014 |

\* cited by examiner

METHOD AND DEVICE FOR DETECTING SENSOR ERRORS

BACKGROUND OF THE INVENTION

1. Field of the Invention

The invention relates to a method for detecting sensor errors, in particular of a piezoelectric sensor for vehicles, where measurements are taken via the sensor, discharge time data with a first discharge time constant of the sensor is read out from a data storage unit of the sensor and corresponding measurement signals as well as the discharge time data are transmitted to a computing unit, where signal processing, signal evaluation and data evaluation occur in the computing unit and where filtered signals are formed by filtering the measurement signals.

2. Description of the Related Art

Vehicles, such as rail vehicles, need to have a high degree of safety while traveling. It is therefore important to be able to estimate and predict with accuracy the technical statuses of vehicles, chassis and other vehicle components.

WO 2014/048768 A1 discloses a diagnostic apparatus for a rail vehicle, where acceleration sensors and an electronic diagnostic unit arranged on a chassis are provided. Corresponding diagnostics of the chassis occur based on acceleration measurements that are evaluated in the diagnostics device.

High quality and a low error rate of measurements are important for vehicle diagnostics. In particular, it is necessary that measurement errors as a result of sensor errors, or damage can be recognized and that erroneous measurement values can be excluded from diagnostic processes or that influences of the errors on the measurements can be reduced.

DE 10 2011 106 302 B3 discloses a method for detecting measurement errors of sensors. With a calibration method, sensor values are initially determined, matrix forces and/or torques are determined via inversion of a measurement, and sensor values are then calculated via inverse transformation of the forces and/or torques pseudo. The sensor values are compared with the pseudo sensor values to detect a possible measurement error therefrom.

This approach in its conventional form has the disadvantage that the measurement errors or errors of the sensors are only captured indirectly, i.e., via the sensor values and the pseudo sensor values.

SUMMARY OF THE INVENTION

In view of the foregoing, it is therefore an object of the invention to provide a more developed method in comparison to the prior art that makes an exact detection of sensor errors possible taking sensor characteristics into consideration.

This and other objects and advantages are achieved in accordance with the invention by a method in which, via a logarithmic function of the filtered signals, parameter values of a time-dependent discharge function in relation to the sensor are determined, a second discharge time constant is determined from the discharge function and by comparing the first discharge time constant and the second discharge time constant errors, faults or damages of the sensor are detected.

This results in a monitoring of the sensor and therefore a high level of reliability and high availability during operation of the sensor and facilitates sensor diagnostics.

The method is based on an evaluation of sensor characteristics, namely the first discharge time constant and the second discharge time constant. Sensor errors are therefore detected with greater reliability, as a result of which the influences of the errors on the measurements can be reduced.

It is favorable if a warning event is generated upon detection of an error, a fault or damage of the sensor.

The error can be visualized for example on a display unit in a driver's cab of the vehicle or in a maintenance station. This measure allows a rapid response to the error. For example, a sensor exchange can be prepared in a timely manner by triggering a spare part procurement.

In an advantageous embodiment, the measurements, the signal processing, the signal evaluation, the data evaluation, the filtering, the logarithmic function, a discharge time constant creation and the comparison are performed continuously.

For example, if the method in accordance with the invention is implemented in a diagnostic and monitoring device of a vehicle and the sensor monitors a vehicle component (e.g., a damper, a wheel, on a spring device), then as a result of this measure a high reliability and availability of a corresponding monitoring and diagnostic method is effected relating to this vehicle component.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained in further detail below with reference to exemplary embodiments, in which.

DETAILED DESCRIPTION OF THE EXEMPLARY PREFERRED EMBODIMENTS

Figure 1:
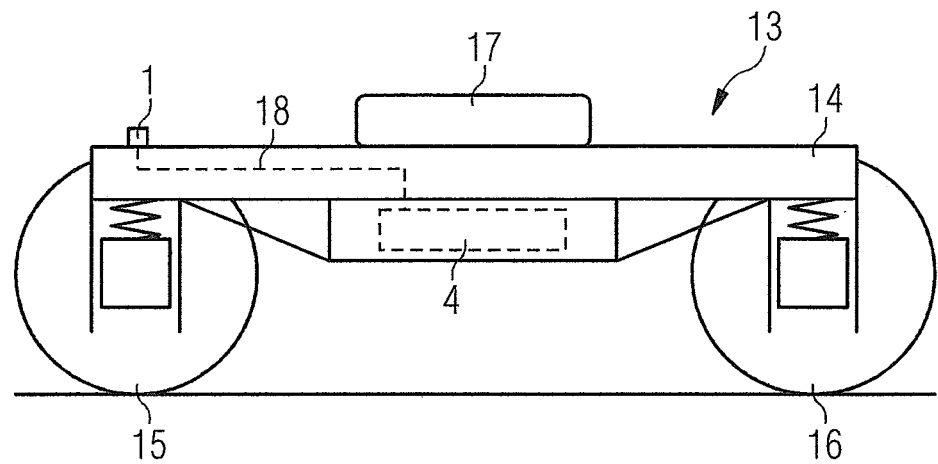
FIG. 1 shows a chassis of a rail vehicle with a sensor and a computing unit which are connected to one another via a cable in accordance with the invention.

FIG. 1 shows a chassis 13 of a vehicle formed as a rail vehicle. The chassis 13 comprises a primary spring-mounted chassis frame 14 that is connected to a first wheelset 15 and a second wheelset 16 and on which a secondary spring device 17 is arranged. The chassis 13 is connected to a vehicle body (not shown).

A sensor 1 is provided on the chassis frame 14 in an area above the first wheelset 15. Furthermore, a computing unit 4, which is connected to the sensor 1 via a cable 18, is arranged on the chassis frame 14.

In accordance with the invention, however, it is also conceivable for the computing unit 4 to be provided, for example, in the vehicle body and for the sensor 1 to be connected to the computing unit 4 via corresponding cable paths between the chassis 13 and the vehicle body.

The sensor 1, the computing unit 4 and the cable 18 form a diagnostic and monitoring device of the rail vehicle, which is used to evaluate accelerations of the chassis frame 14 and to determine vehicle component defects (e.g., a damper) by evaluating acceleration information.

The sensor 1 is supplied with electricity via the computing unit 4 and the cable 18. Furthermore, the cable 18 also transfers data between the sensor 1 and the computing unit 4.

The computing unit 4 is also connected to a vehicle on-board electrical system and a vehicle on-board data bus that are not shown.

Figure 2:
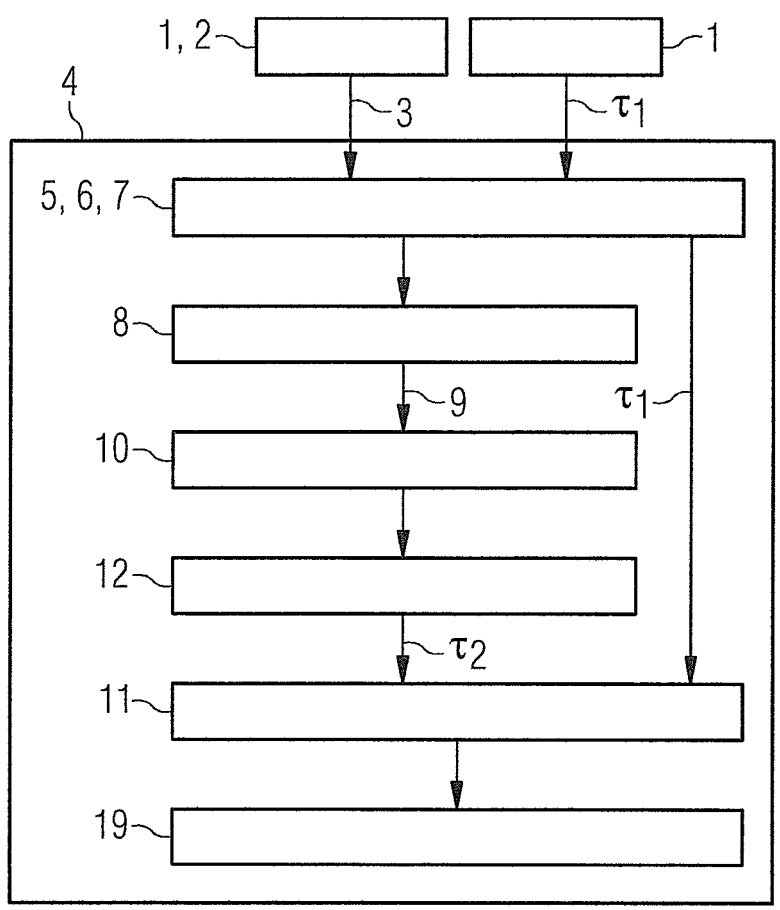
FIG. 2 shows a flow diagram relating to an exemplary embodiment of an inventive method for detecting sensor errors in accordance with the invention.

With the sensor 1 and the computing unit 4, an exemplary embodiment of an inventive method described in conjunction with FIG. 2 is performed.

An exemplary embodiment of an inventive, partially computer-implemented method shown schematically as a flow diagram in FIG. 2 is implemented in a vehicle formed as a rail vehicle (not shown).

A sensor 1 that is also shown in FIG. 1 and comprises a piezoelectric sensor 1 (Integrated Circuit Piezoelectric sensor, i.e., ICP sensor) performs measurements 2 of accelerations of a chassis frame 14 also shown in FIG. 1. Corresponding measurement signals 3 are transmitted via a cable 18 shown in FIG. 1 to a computing unit 4 also shown in FIG. 1.

Furthermore, discharge time data, which includes a first discharge time constant $\tau_1$ of the sensor 1, is read out from a Transducer Electronic Data Sheet (TEDS) of a data storage unit of the sensor 1 via the computing unit 4, i.e., transmitted from the sensor 1 to the computing unit 4 via the cable 18.

Within the computing unit 4, signal processing 5 and signal evaluation 6 relating to the measurement signals 3 occur, where acceleration information relating to the chassis frame 14 is extracted from the measurement signals 3.

Furthermore, data evaluation 7 is performed via which the specified first discharge time constant $\tau_1$ is extracted from the discharge time data.

Moreover, filtering 8 performed as a bandpass filtering of the measurement signals 3 occurs, where filtered signals 9 are formed from the measurement signals 3.

Absolute values of the filtered signals 9 are transferred via a logarithmic function 10 into parameter values of a discharge function b⁻ relating to the sensor 1.

The measurements 2, the signal processing 5, the signal evaluation 6, the data evaluation 7, the filtering 8 and the logarithmic function 10 are performed continuously during an operation of the vehicle at a frequency of 10 Hz, where lower or higher frequencies are naturally also conceivable.

Accordingly, a number of parameter values for the discharge function b⁻ are formed via the exemplary embodiment of the inventive method.

The discharge function b⁻ is based on an exponential first formation rule $y_1$, where $$y_1 = C \cdot \exp\left(-\frac{t}{\tau_2}\right) \qquad \text{Eq. 1}$$

The first formation rule $y_1$ has a constant C, a time t and a second discharge time constant $\tau_2$ and describes a discharge process of the sensor 1. A second linear formation rule $y_2$ based on the first formation rule $y_1$ is as follows:

$$y_2 = \log(C) + \left(-\frac{1}{\tau_2}\right) \cdot t \qquad \text{Eq. 2}$$

The second formation rule $y_2$ has a gradient k where $$k = -\frac{1}{\tau_2} \qquad \text{Eq. 3}$$

The vector-valued, time-dependent discharge function b⁻ with a first component $b_1$ and a second component $b_2$ is formed from the second formation rule $y_2$ as follows:

$$b^- = \begin{pmatrix} \log(c) \\ \left(-\frac{1}{\tau_2}\right) \end{pmatrix} = (X^T X)^{-1} X \cdot y^- = \begin{pmatrix} ((X^T X)^{-1} X \cdot y^-)_1 \\ ((X^T X)^{-1} X \cdot y^-)_2 \end{pmatrix} = \begin{pmatrix} b_1 \\ b_2 \end{pmatrix} \qquad \text{Eq. 4}$$

The discharge function b⁻ comprises a time matrix X with a first time $t_1$, a second time $t_2$ up to an N time $t_N$, which is defined as follows:

$$X = \begin{bmatrix} 1 & t_1 \\ 1 & t_2 \\ \vdots & \vdots \\ 1 & t_N \end{bmatrix} \qquad \text{Eq. 5}$$

Furthermore, the discharge function b⁻ has a parameter vector y⁻ with a first parameter value $y_{21}$, a second parameter value $y_{22}$ up to an N parameter value $y_{2N}$, which correlate to the first time $t_1$, the second time $t_2$ up to the N time $t_N$ and are formed from the filtered signals 9, which is defined as follows:

$$y^- = \begin{bmatrix} y_{21} \\ y_{22} \\ \vdots \\ y_{2N} \end{bmatrix} \qquad \text{Eq. 6}$$

The parameter values correspond to function values of the second formation rule $y_2$.

The gradient k is determined from the discharge function b⁻ and the second discharge time constant $\tau_2$ is determined from the gradient k via the least squares method, where a conventional equalization sum method applies, from the following correlations (discharge time constant creation 12):

$$k = b_2 = ((X^T X)^{-1} X \cdot y^-)_2 \qquad \text{Eq. 7}$$

$$\tau_2 = -\frac{1}{k} \qquad \text{Eq. 8}$$

A comparison 11 of the first discharge time constant $\tau_1$ and the second discharge time constant $\tau_2$ allows a build-up of measurement signals 3 and therefore errors, faults or damage of the sensor 1 to be detected.

The discharge time constant creation 12 and the comparison 11 are continuously performed at a frequency of 10 Hz, where lower or higher frequencies can naturally also be set.

In accordance with the invention, it is also conceivable for the measurements 2, on the one hand, and the signal processing 5, the signal evaluation 6, the data evaluation 7, the filtering 8, the logarithmic function 10, the discharge time constant creation 12 and the comparison 11, on the other hand, to be performed at different frequencies.

An error, a fault or damage of the sensor 1 is detected when a difference between the first discharge time constant $\tau_1$ and the second discharge time constant $\tau_2$ falls below a defined first limit value and when a Root Mean Square Error (RSME) of the second discharge time constant $\tau_2$ falls below a defined second limit value.

If an error, a fault or damage of the sensor 1 is determined, a warning event or a warning signal is generated (warning event generation 19). This is routed from the computing unit 4 via a vehicle on-board data bus as described in conjunction with FIG. 1 to a driver's cab of the vehicle and is displayed on a display unit.

In accordance with the invention, it is also possible to transmit the warning signal or information concerning the first discharge time constant $\tau_1$ and the second discharge time constant $\tau_2$, i.e., diagnostic and monitoring signals relating to the sensor 1, via radio by a vehicle antenna connected to the computing unit 4 and arranged on the roof of the vehicle to a maintenance station with a corresponding receiving unit for further evaluation on a maintenance computer, where diagnostics or a prediction of the remaining service life of the sensor 1 is performed.

It is furthermore conceivable for the sensor 1 to be switched off upon detection of an error, a fault or damage, to which end the computing unit 4 deactivates a power supply of the sensor 1 via a cable 18 that is also described in conjunction with FIG. 1.

Figure 3:
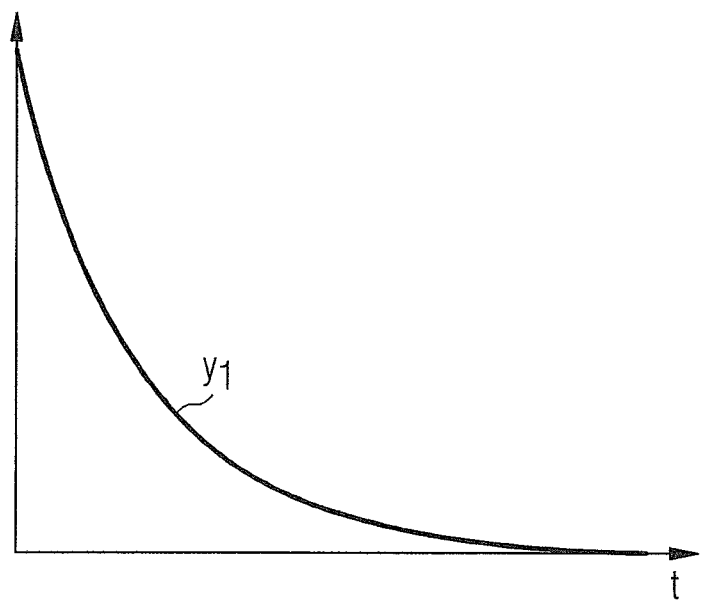
FIG. 3 shows a first diagram with an exponential first formation rule for a discharge function relating to a sensor in accordance with the invention.

In FIG. 3, an exponential first formation rule $y_1$ described in conjunction with FIG. 2 is shown as a first diagram as a basis for a discharge function b⁻ of a sensor 1, also disclosed in conjunction with FIG. 2.

Times t are plotted on an abscissa of the first diagram, and function values extracted from filtered signals 9 mentioned in conjunction with FIG. 2 are plotted on an ordinate.

Figure 4:
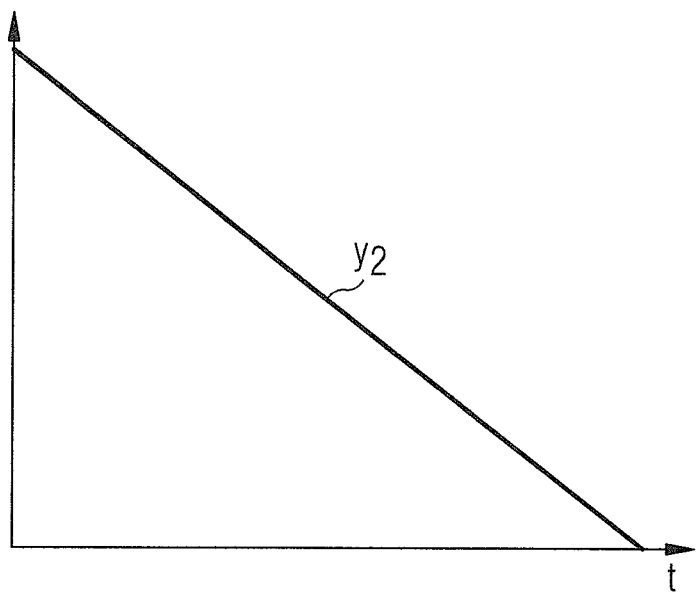
FIG. 4 shows a second diagram with a linear second formation rule for a discharge function relating to a sensor in accordance with the invention.

In FIG. 4 a linear second formation rule $y_2$ described in conjunction with FIG. 2 is shown as a second diagram for a discharge function b⁻ of a sensor 1, also disclosed in conjunction with FIG. 2.

Times t are plotted on an abscissa of the second diagram, and function values formed via a logarithmic function 10 from filtered signals 9 mentioned in conjunction with FIG. 2 are plotted on an ordinate. The function values correspond to the discharge function b⁻ in conjunction with the parameter values described in FIG. 2.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for detecting sensor errors, via which measurements are obtained, discharge time data with a first discharge time constant of the sensor is read out from a data storage unit of the sensor and corresponding measurement signals as well as a discharge time data are transmitted to a computing unit, a signal processing, a signal evaluation and a data evaluation occurring in the computing unit and filtered signals being formed via filtering of the measurement signals, the method comprising:
   determining, via a logarithmic function of the filtered signals, parameter values of a time-dependent discharge function in relation to the sensor; and
   determining a second discharge time constant from the discharge function and comparing the first discharge time constant and the second discharge time constant to detect faults or damage of the sensor.

2. The method as claimed in claim 1, wherein the second discharge time constant is determined from a gradient k of the time-dependent discharge function.

3. The method as claimed in claim 2, wherein a warning event is generated upon detection of an error, a fault or damage of the sensor.

4. The method as claimed in claim 2, wherein the measurements, the signal processing, the signal evaluation, the data evaluation, the filtering, the logarithmic function, a discharge time constant creation and the comparison are performed continuously.

5. The method as claimed in claim 1, wherein a warning event is generated upon detection of an error, a fault or damage of the sensor.

6. The method as claimed in claim 5, wherein the measurements, the signal processing, the signal evaluation, the data evaluation, the filtering, the logarithmic function, a discharge time constant creation and the comparison are performed continuously.

7. The method as claimed in claim 1, wherein the measurements, the signal processing, the signal evaluation, the data evaluation, the filtering, the logarithmic function, a discharge time constant creation and the comparison are performed continuously.

8. The method as claimed in claim 1, wherein the second discharge time constant is determined via an equalization sum.

9. The method as claimed in claim 8, wherein an error, a fault or damage of the sensor is detected when a difference between the first discharge time constant and the second discharge time constant falls below a defined first limit value and when a root mean square error of the second discharge time constant falls below a defined second limit value.

10. The method as claimed in claim 1, wherein the sensors comprise a piezoelectric sensor for vehicles.

11. A device comprising:
   a sensor; and
   a computing unit;
   wherein the sensor and the computing unit are arranged on a vehicle; and
   wherein the device is configured to:
      determine, via a logarithmic function of filtered signals, parameter values of a time-dependent discharge function in relation to the sensor;

determine a second discharge time constant from the discharge function and compare a first discharge time constant and the second discharge time constant to detect faults or damage of the sensor.

12. The device as claimed in claim 11, wherein the sensor and the computing unit are provided on a chassis of the vehicle.

13. The device as claimed in claim 12, wherein the sensor and the computing unit comprise parts of a diagnostic and monitoring device of the vehicle.

14. The device as claimed in claim 11, wherein the sensor is provided on a chassis of the vehicle and the computing unit is provided in or on a vehicle body of the vehicle.

15. The device as claimed in claim 14, wherein the sensor and the computing unit comprise parts of a diagnostic and monitoring device of the vehicle.

16. The device as claimed in claim 11, wherein the sensor and the computing unit comprise parts of a diagnostic and monitoring device of the vehicle.

17. The device as claimed in claim 11, wherein the computing unit is connected to a display unit upon which a detected error, a detected fault or a detected damage of the sensor can be displayed.

18. The device as claimed in claim 11, further comprising:
- an antenna arranged on or in the vehicle and connected to the computing unit, said antenna being configured to transmit diagnostic and monitoring signals in relation to the sensor.

\* \* \* \* \*